(12) United States Patent
Palacios et al.

(10) Patent No.: US 9,293,538 B2
(45) Date of Patent: Mar. 22, 2016

(54) DIODE HAVING TRENCHES IN A SEMICONDUCTOR REGION

(71) Applicant: Massachusetts Institute of Technology, Cambridge, MA (US)

(72) Inventors: Tomas Apostol Palacios, Cambridge, MA (US); Bin Lu, Boston, MA (US); Elison de Nazareth Matioli, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 9 days.

(21) Appl. No.: 14/082,618

(22) Filed: Nov. 18, 2013

(65) Prior Publication Data

US 2014/0070228 A1    Mar. 13, 2014

Related U.S. Application Data

(62) Division of application No. 13/649,658, filed on Oct. 11, 2012, now Pat. No. 9,041,003.

(60) Provisional application No. 61/545,925, filed on Oct. 11, 2011.

(51) Int. Cl.
*H01L 31/0256*     (2006.01)
*H01L 27/01*     (2006.01)
*H01L 27/12*     (2006.01)
(Continued)

(52) U.S. Cl.
CPC ...... *H01L 29/2003* (2013.01); *H01L 21/28264* (2013.01); *H01L 29/1029* (2013.01); *H01L 29/407* (2013.01); *H01L 29/417* (2013.01); *H01L 29/4236* (2013.01); *H01L 29/42316* (2013.01); *H01L 29/7786* (2013.01);

(Continued)

(58) Field of Classification Search
CPC ............................ H01L 29/8725; H01L 29/417
USPC .......... 257/76, 368, 401, 347, 407, 104, 107, 257/183, 471, 487, 497, 594, 603
See application file for complete search history.

(56) References Cited

U.S. PATENT DOCUMENTS

| 4,182,023 A | 1/1980 | Cohen et al. |
| 6,919,601 B2 | 7/2005 | Inaba |

(Continued)

FOREIGN PATENT DOCUMENTS

JP     2009 177028     8/2009

OTHER PUBLICATIONS

International Search Report and Written Opinion dated Mar. 11, 2013 from International Application No. PCT/US2012/059744.

(Continued)

*Primary Examiner* — A. Sefer
*Assistant Examiner* — Dilinh Nguyen
(74) *Attorney, Agent, or Firm* — Wolf, Greenfield & Sacks, P.C.

(57) ABSTRACT

An electrode structure is described in which conductive regions are recessed into a semiconductor region. Trenches may be formed in a semiconductor region, such that conductive regions can be formed in the trenches. The electrode structure may be used in semiconductor devices such as field effect transistors or diodes. Nitride-based power semiconductor devices are described including such an electrode structure, which can reduce leakage current and otherwise improve performance.

15 Claims, 18 Drawing Sheets

(51) Int. Cl.
| | |
|---|---|
| H01L 31/0392 | (2006.01) |
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/20 | (2006.01) |
| H01L 21/28 | (2006.01) |
| H01L 29/872 | (2006.01) |
| H01L 29/40 | (2006.01) |
| H01L 29/423 | (2006.01) |
| H01L 29/778 | (2006.01) |
| H01L 29/10 | (2006.01) |
| H01L 29/417 | (2006.01) |
| H01L 29/51 | (2006.01) |

(52) U.S. Cl.
CPC .......... *H01L29/872* (2013.01); *H01L 29/8725* (2013.01); *H01L 29/513* (2013.01); *H01L 29/517* (2013.01)

(56) References Cited

U.S. PATENT DOCUMENTS

| | | | |
|---|---|---|---|
| 7,259,425 | B2 | 8/2007 | An et al. |
| 8,530,931 | B2 | 9/2013 | Asano et al. |
| 2004/0183115 | A1* | 9/2004 | Lanois ................ H01L 29/404 257/302 |
| 2004/0227211 | A1 | 11/2004 | Saito et al. |
| 2005/0127464 | A1 | 6/2005 | Wu |
| 2005/0145883 | A1 | 7/2005 | Beach |
| 2005/0189561 | A1 | 9/2005 | Kinzer et al. |
| 2005/0285204 | A1 | 12/2005 | Kim |
| 2006/0054959 | A1* | 3/2006 | Mauder et al. ............... 257/301 |
| 2008/0214004 | A1* | 9/2008 | Poelzl et al. ................. 438/689 |
| 2008/0315256 | A1 | 12/2008 | Ohta et al. |
| 2009/0206371 | A1 | 8/2009 | Oka |
| 2011/0204380 | A1 | 8/2011 | Yoshioka et al. |
| 2012/0007053 | A1* | 1/2012 | Jeon et al. ...................... 257/28 |
| 2012/0248530 | A1* | 10/2012 | Lui et al. ....................... 257/334 |

OTHER PUBLICATIONS

W. B. Lanford, T. Tanaka, Y. Otoki, and I. Adesida, "Recessed-Gate Enhancement-Mode GaN HEMT with High Threshold Voltage," Electronics Letters, vol. 41, p. 449, 2005.

W. Saito, Y. Takada, M. Kuraguchi, K. Tsuda, and I. Omura, "Recessed-Gate Structure Approach Toward Normally Off High-Voltage AlGaN/GaN HEMT for Power Electronics Applications," IEEE Transactions on Electron Devices, vol. 53, pp. 356-362, Feb. 2006.

Bin Lu, 0. I. Saadat, E. L. Piner, and T. Palacios, "Enhancement-mode AlGaN/GaN HEMTs with High Linearity Fabricated by Hydrogen Plasma Treatment," in Device Research Conference, 2009. DRC 2009, pp. 59-60.

Yong Cai, Yugang Zhou, K. J. Chen, and K. M. Lau, "High-performance enhancement-mode AlGaN/GaN HEMTs Using Fluoride-Based Plasma Treatment," IEEE Electron Device Letters, vol. 26, pp. 435-437, Jul. 2005.

W. Huang, T. Chow, Y. Niiyama, T. Nomura, and S. Yoshida, "730V, 34mCI-cm2 lateral epilayer RESURF GaN MOSFET," in Power Semiconductor Devices & IC's, 2009. ISPSD 2009. 21st International Symposium on, pp. 29-32.

Ki-Sik Im et al., "Normally Off GaN MOSFET Based on AlGaN/GaN Heterostructure With Extremely High 2DEG Density Grown on Silicon Substrate," IEEE Electron Device Letters, vol. 31, pp. 192-194, Mar. 2010.

Y. Uemoto et al., "Gate Injection Transistor (GIT)—A Normally-Off AlGaN/GaN Power Transistor Using Conductivity Modulation," IEEE Transactions on Electron Devices, vol. 54, pp. 3393-3399, 2007.

B. S. Doyle et al., "High performance fully-depleted tri-gate CMOS transistors," IEEE Electron Device Letters, vol. 24, pp. 263-265, Apr. 2003.

O. Ambacher et al., "Two dimensional electron gases induced by spontaneous and piezoelectric polarization in undoped and doped AlGaN/GaN heterostructures," Journal of applied physics, vol. 87, p. 334, 2000.

K. Ohi and T. Hashizume, "Drain Current Stability and Controllability of Threshold Voltage and Subthreshold Current in a Multi-Mesa-Channel AlGaN/GaN High Electron Mobility Transistor," Japanese Journal of Applied Physics, vol. 48, p. 081002, Aug. 2009.

Bin Lu, "Tri-Gate Normally-Off GaN Power MISFET," IEEE Electron Device Letters, vol. 33, No. 3, Mar. 2012.

Supplementary European Search Report from European Application No. EP 12 83 9713 dated Jun. 1, 2015.

\* cited by examiner

SEM Top View

SEM Cross Section

DIODE HAVING TRENCHES IN A SEMICONDUCTOR REGION

CROSS-REFERENCE TO RELATED APPLICATIONS

This application claims priority under 35 U.S.C. §120 as a divisional application of U.S. patent application Ser. No. 13/649,658 filed Oct. 11, 2012 and entitled "Semiconductor Devices Having A Recessed Electrode Structure," which claims the benefit under 35 U.S.C. §119(e) of U.S. provisional application 61/545,925, filed Oct. 11, 2011 and entitled "Tri-Gate Normally-Off GaN MISFET," the contents of both of which are incorporated herein by reference in their entireties.

STATEMENT REGARDING FEDERALLY SPONSORED RESEARCH OR DEVELOPMENT

This invention was made with government support under Grant No. N00014-09-1-0864 awarded by the US Office of Naval Research and under Contract No. DE-AR0000123 awarded by the Department of Energy. The government has certain rights in this invention.

BACKGROUND

1. Field of Invention

The techniques and apparatus described herein relate to semiconductor structures having an electrode structure in which conductive regions are recessed in a semiconductor region, and particularly to semiconductor devices, such as nitride-based semiconductor devices, using one or more such electrode structures.

2. Discussion of the Related Art

Improved power transistors are desired for advanced transportation systems, more robust energy delivery networks and new approaches to high-efficiency electricity generation and conversion. Such systems rely on very efficient converters to step-up or step-down electric voltages, and use power transistors capable of blocking large voltages. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore such commercial devices are unsuitable for future generations of hybrid vehicles and other applications.

Nitride semiconductor devices have been proposed as offering the potential for producing high-efficiency power electronics demanding high blocking voltages and low on-resistances.

SUMMARY

Some embodiments relate to a field effect transistor that includes a source region and a drain region. The field effect transistor also includes a semiconductor region between the source region and the drain region. The semiconductor region has trenches extending along a direction that extends between the source region and the drain region. The field effect transistor also includes a conductive electrode having conductive regions formed in the trenches. The conductive electrode extends no more than a portion of a distance between the source region and the drain region. The field effect transistor also has an insulating region between the semiconductor region and the conductive electrode. The insulating region extends at least partially across an interface between the semiconductor region and the conductive electrode.

Some embodiments relate to a diode including a semiconductor region having trenches formed therein. The diode includes a conductive electrode forming an anode of the diode. The conductive electrode includes conductive regions formed in the trenches of the semiconductor region.

Some embodiments relate to a semiconductor structure that includes a semiconductor region including a III-N semiconductor material. The semiconductor region has trenches formed therein. The semiconductor structure also includes a conductive electrode. The conductive electrode includes conductive regions formed in the trenches of the semiconductor region. The semiconductor structure also has an insulating region between the semiconductor region and the conductive electrode. The insulating region extends at least partially across an interface between the semiconductor region and the conductive electrode.

Some embodiments relate to a method of forming a semiconductor structure. The method includes forming trenches in a semiconductor region, the semiconductor region including a III-N semiconductor material. The method also includes forming an insulating region over at least a portion of the semiconductor region. The method also includes forming conductive electrode regions in the trenches of the semiconductor region. The insulating region extends at least partially across an interface between the semiconductor region and the conductive electrode.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 2b show a cross section of a field effect transistor along the line B-B of FIG. 2a.

DETAILED DESCRIPTION

As discussed above, nitride semiconductor devices have been proposed as offering the potential for producing high-efficiency power electronics with high blocking voltages and low on-resistances. However, there are several technical problems with conventional nitride-based semiconductor devices. One problem is that conventional nitride-based semiconductor devices suffer from excessive leakage current in the off-state. For example, in nitride-based field effect transistors, the off-state leakage current between the source and drain terminals can flow below the channel region at high drain bias voltage. The breakdown voltages of conventional GaN (Gallium Nitride) based transistors are reported in the literature at a leakage current level of 1 mA/mm. Such a high value of leakage current is not practical for large size power transistors typically having a width of more than 100 mm.

Another challenge is to make high performance normally-off nitride-based transistors. The conventional methods of making normally-off nitride-based transistors include 1) gate-recess techniques, 2) plasma treatment, 3) forming GaN MISFETs and 4) forming gate-injection GaN transistors. These conventional techniques either degrade the channel mobility or have limited gate over-drive capability, resulting in a high channel resistance and low drain current density.

Described herein are nitride semiconductor devices and associated techniques that can reduce leakage current (e.g., to 1 µA/mm or less) and enable high-performance normally-off nitride-based transistors. Electrode structures are described herein which may be used to improve performance in semiconductor devices such as transistors and diodes. Such electrode structures include regions of conductive material recessed in a semiconductor region. For example, the electrode structures may include regions of conductive material formed in trenches in a semiconductor region. Nitride semiconductor devices formed using electrode structures as described herein can achieve reduced off-state leakage currents, as discussed below. Normally-off nitride-based transistors are described that have improved performance as a result of reduced on-resistance and increased current density. Exemplary electrode structures are described that may be used in transistors, diodes, or any other suitable semiconductor devices.

Figure 1A:
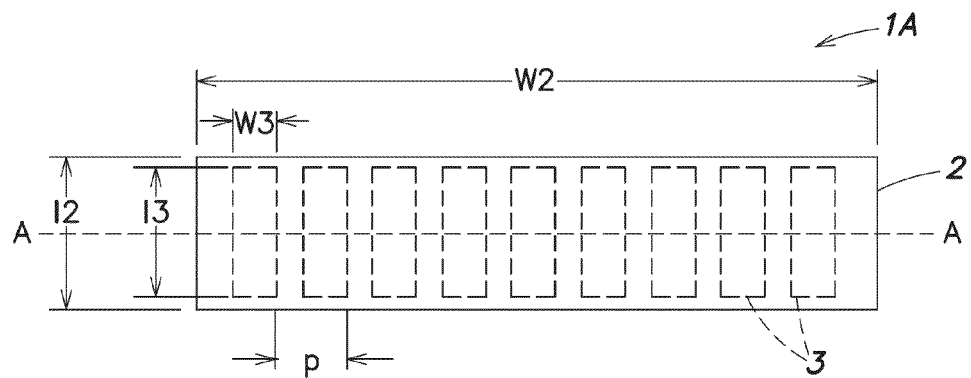
FIG. 1a shows a top view of an electrode structure, according to some embodiments.

FIG. 1a shows a top view of an electrode structure 1a which may be formed in a semiconductor chip, according to some embodiments. FIG. 1a shows a top view of a region of an exemplary semiconductor chip including electrode structure 1a. As shown in FIG. 1a, electrode structure 1a includes an upper electrode region 2 and lower electrode regions 3 extending downward from the upper electrode region 2. As shown in FIG. 1a, the lower electrode regions 3 may include conductive plates or other regions extending parallel to one another. The lower electrode regions 3 may have a patterned structure. As shown in the example of FIG. 1a, the lower electrode regions 3 may have a periodic structure of a period p. The lower electrode regions 3 may have a length $l_3$ and a width $w_3$, as shown in FIG. 1a. The upper electrode region 2 may have a length $l_2$ and a width $w_2$.

Figure 1B:
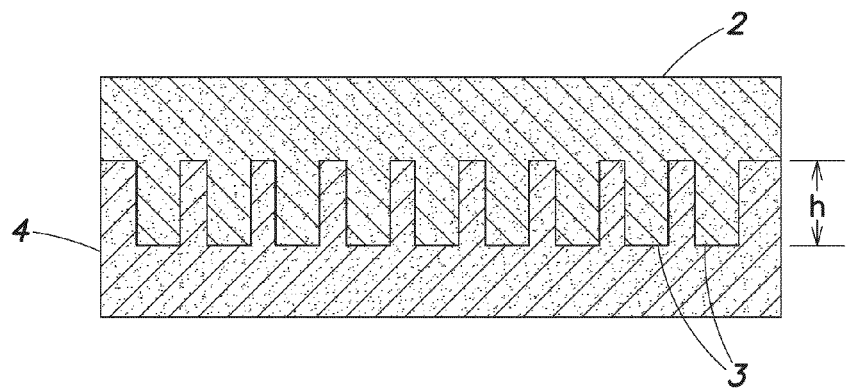
FIG. 1b shows a cross section of an electrode structure along the line A-A in FIG. 1a in which lower portions of the electrode structure are formed in trenches in a semiconductor region, according to some embodiments.

FIG. 1b shows a cross section of the electrode structure of FIG. 1a along the line A-A of FIG. 1a. As shown in FIG. 1b, the upper electrode region 2 may be formed over a semiconductor region 4. The lower electrode regions 3 are recessed within the semiconductor region 4, as lower electrode regions 3 extend downward from the upper electrode region 2 into the semiconductor region 4. In the example shown in FIG. 1b, the lower electrode regions 3 are formed in trenches in the semiconductor region 4. The lower electrode regions 3 may fill all or a portion of the trenches. The trenches have a height h. The portions of semiconductor region 4 between the trenches are referred to herein as upwardly-extending portions of the semiconductor region 4.

Figure 1C:
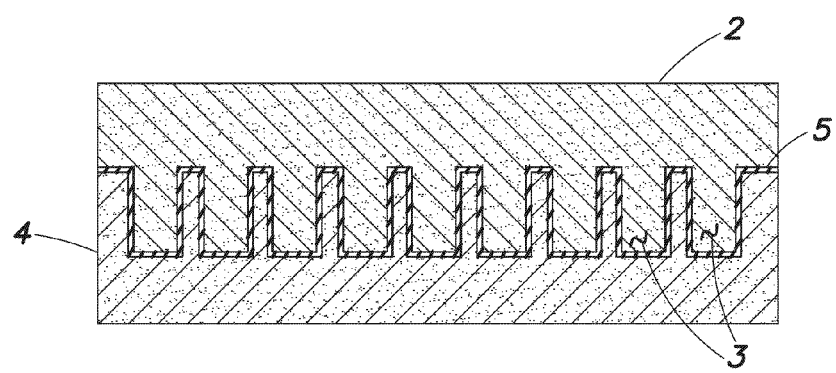
FIG. 1c shows a cross section of an electrode structure along the line A-A in FIG. 1a in which an insulating material is present between a semiconductor region and at least a portion of the electrode structure.

FIG. 1c shows the cross section of another embodiment of an electrode structure in which an insulating material 5 is present between the semiconductor region 4 and the electrode structure 1a. In such an embodiment, insulating material 5 may be present along the entire interface between the semiconductor region 4 and the electrode structure 1a or a portion of the interface between the semiconductor region 4 and the electrode structure.

Figure 1D:
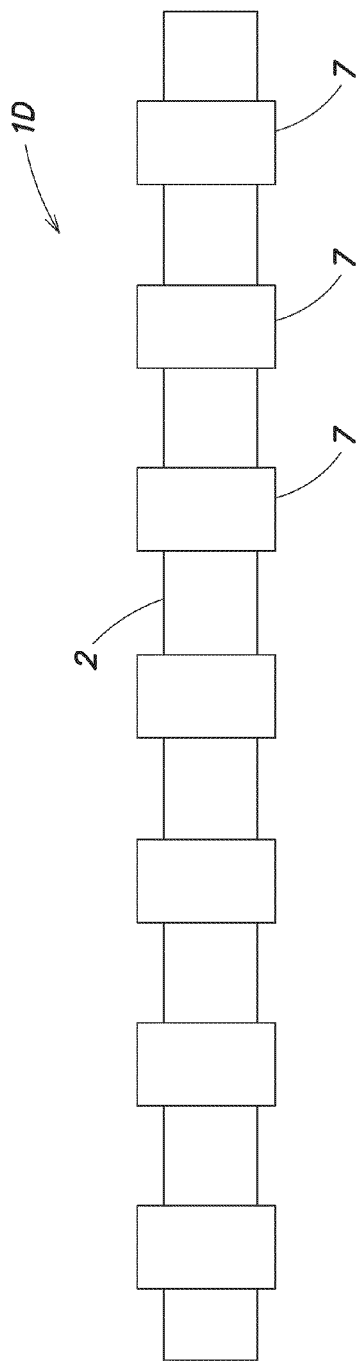
FIG. 1d shows a top view of an electrode structure in which trenches in the semiconductor extend beyond an area of the chip covered by an upper portion of the electrode.

FIG. 1d shows the top view of another variation of an embodiment of an electrode structure 1d in which the trenches 7 extend beyond the area of the chip covered by the upper electrode region 2 on both a first side and a second side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. Electrode structure 1d may have a cross section as illustrated in FIG. 1b or FIG. 1c, for example.

Figure 1E:
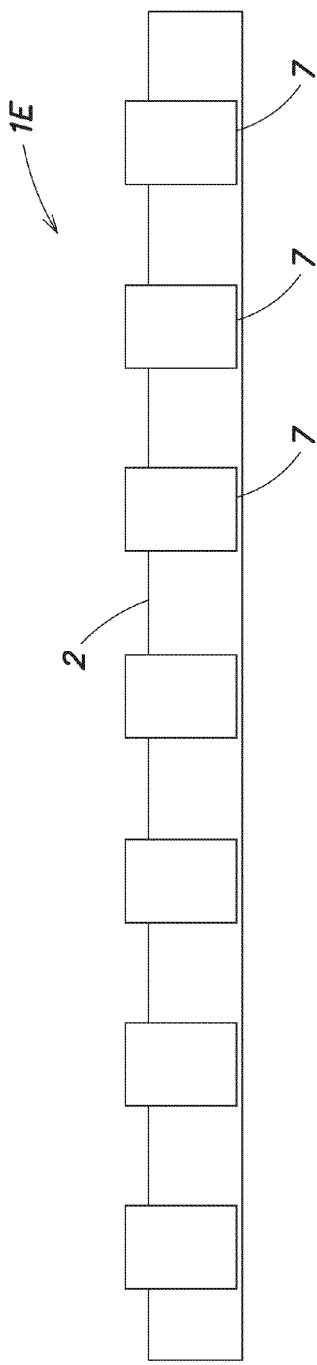
FIG. 1e shows a top view of an electrode structure in which trenches in the semiconductor extend beyond an area of the chip covered by an upper portion of the electrode on a first side of the electrode.

FIG. 1e shows the top view of another variation of an embodiment of an electrode structure 1e in which the trenches 7 extend beyond the area of the chip covered by the upper electrode region 2 on one side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. Electrode structure 1e may have a cross section as illustrated in FIG. 1b or FIG. 1c, for example.

Any suitable electrode structure may be used. In some embodiments, an electrode structure 1 may be used having a top view as illustrated in FIG. 1a, 1d, or 1e. The electrode structure may have any suitable cross section, such as those shown in FIGS. 1b and 1c. The reference to "electrode structure 1" herein is used to refer to an electrode structure as illustrated in any of FIGS. 1a, 1d and 1e, having any suitable cross section, such as those illustrated in FIGS. 1b and 1c.

A variety of suitable materials may be used for the electrode structure 1, semiconductor region 4, and insulating material 5. In some embodiments, semiconductor region 4 includes one or more layers of III-V semiconductor material, such as a III-N semiconductor material including a group III element and nitrogen. Examples of suitable group III-N materials include GaN (Gallium Nitride), $Al_{x1}Ga_{1-x1}N$ (Aluminum Gallium Nitride with any suitable Aluminum content x1) and $Al_{x2}In_{y2}Ga_{z2}N$ (Aluminum Indium Gallium Nitride with any suitable Aluminum, Indium and Gallium contents x2, y2 and z2, respectively, where x2+y2+z2=1 and each of x2, y2 and z2 is greater than or equal to 0 and less than or equal to 1), by way of example. However, any suitable types of semiconductor materials may be used. In some embodiments, semiconductor region 4 may include a group IV semiconductor such as Si (Silicon) and/or Ge (Germanium) and/or SiC (Silicon Carbide) and/or diamond. However, any suitable type of semiconductor material may be used, not limited to III-V or group IV semiconductors. Electrode structure 1 may be formed of a metal, a metal alloy, or any other suitable conductive material, such as a doped semiconductor material, for example. Upper electrode region 2 and lower electrode regions 3 may be formed of the same material or a different material. In some embodiments, a wide bandgap material (e.g., aluminum nitride) may be used. If an insulating material 5 is present, any suitable type of insulating material may be used for insulating material 5 such as an oxide (e.g., silicon oxide), a nitride (e.g., silicon nitride), etc.

Electrode structures such as those shown in FIGS. 1a-1e may be included in semiconductor devices such as transistors and diodes, for example. In some embodiments, a field effect transistor (FET) may include an electrode structure as described herein for one or more of the following electrodes: the gate electrode, the source electrode, or the drain electrode. In some embodiments, a field effect transistor may be formed in which an electrode structure as described herein is included as a field plate or an anode of a body diode. Embodiments of transistors that include at least one such electrode structure are described herein.

The use of an electrode structure having an electrode region recessed within a semiconductor region can enable reducing the leakage current for field effect transistors. In conventional nitride-based transistors, when the transistor is in the off-state and blocking a voltage present at the drain, leakage current can flow between the source and drain regions beneath the channel region of the transistor due to the reduction of channel barrier height. This phenomenon is referred to as DIBL (Drain Induced Barrier Lowering). The effect of DIBL may be particularly large for transistors with smaller gate lengths. The present inventors have appreciated that conventional gate electrodes are ineffective to reduce the leakage current that flows below the channel region of the transistor. The electrode structures described herein can reduce leakage current flowing below the channel region through the use of electrode regions extending down into the semiconductor region, e.g., on the sides of the channel region. When such an electrode is used as the gate of the transistor or as a field plate, for example, portions of the electrode are closer to the region below the channel in which leakage current tends to flow, enabling increasing the potential barrier in this region and reducing the leakage current.

Figure 2A:
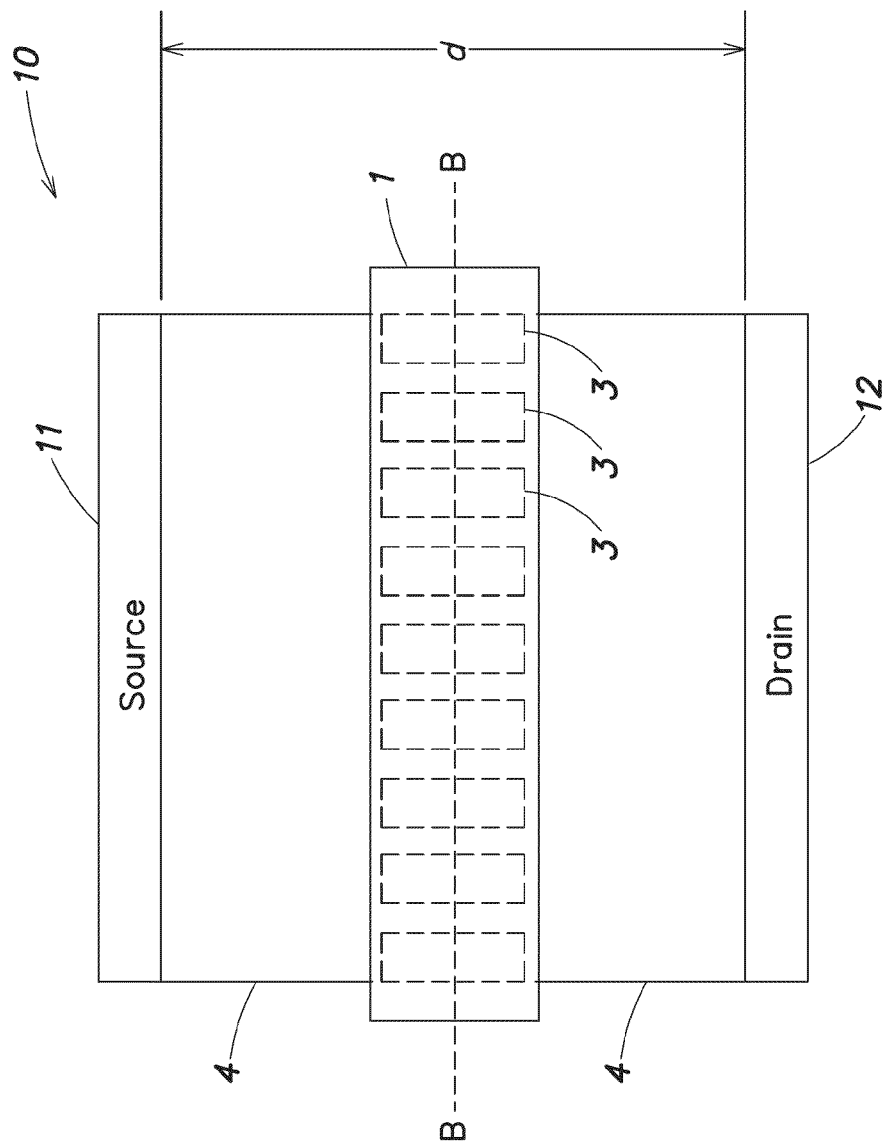
FIG. 2a shows a top view of a field effect transistor, according to some embodiments.

FIG. 2a shows an example of a field effect transistor 10 formed in a semiconductor region 4, according to some embodiments. In some embodiments, the field effect transistor 10 may be a HEMT (High Electron Mobility Transistor), MIS-HEMT (Metal-Insulator-Semiconductor-HEMT), MISFET (Metal-Insulator-Semiconductor Field Effect Transistor), JFET (Junction Field Effect Transistor) or MESFET (Metal-Semiconductor Field Effect Transistor). Field effect transistor 10 includes a source region 11 and a drain region 12. Between source region 11 and drain region 12 is formed an electrode structure 1. Although electrode structure 1 is shown as having a configuration as illustrated in FIG. 1a, electrode structure 1 may be formed in a different configuration, such as those shown in FIGS. 1d and 1e. As shown in FIG. 2a, the electrode structure 1 extends only a portion of the distance d between the source region 11 and the drain region 12. The semiconductor region 4 may include drift and/or diffusion regions between the gate and the source 11 and/or drain 12. In some embodiments, electrode structure 1 may form the gate of the field effect transistor 10. As discussed above with respect to FIG. 1, trenches may be formed in the semiconductor region 4, and the lower electrode regions 3 of the electrode structure 1 may be formed in the trenches, such that the lower electrode regions 3 of the electrode structure 1 extend into the semiconductor region 4. As shown in FIG. 2a, the trenches in which the lower electrode regions 3 are formed extend along a direction that extends between the source region and the drain region. The direction in which the trenches extend may be parallel to a direction of current flow in channel regions of the field effect transistor 10.

Figure 2B:
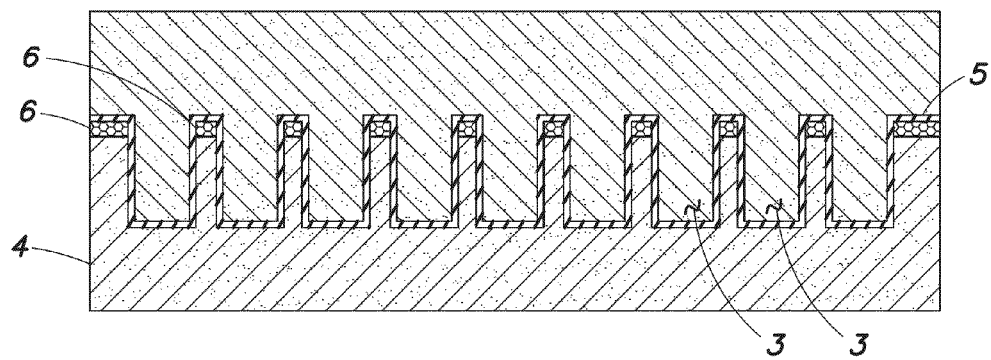

FIG. 2b shows a cross section of the field effect transistor 10 along the line B-B shown in FIG. 2a, according to some embodiments. FIG. 2b shows that a second semiconductor region 6 can be formed above semiconductor region 4. As shown in FIG. 2b, a second semiconductor region 6 may be formed between each upwardly-extending portion of semiconductor region 4 and the upper electrode region 2 of the electrode structure 1. A first semiconductor region 4 and the second semiconductor region 6 may be formed of different materials to form a heterostructure that establishes a channel at the interface of semiconductor regions 4 and 6 for establishing conduction using a two-dimensional electron gas (2DEG). Second semiconductor region 6 may be referred to as a "barrier region." The second semiconductor region 6 may include a semiconductor material having a bandgap larger than that of the first semiconductor region 4. In some embodiments, the second semiconductor region 6 may include several semiconductor layers to introduce a conduction (and/or valence) band discontinuity with semiconductor region 4.

Figure 2C:
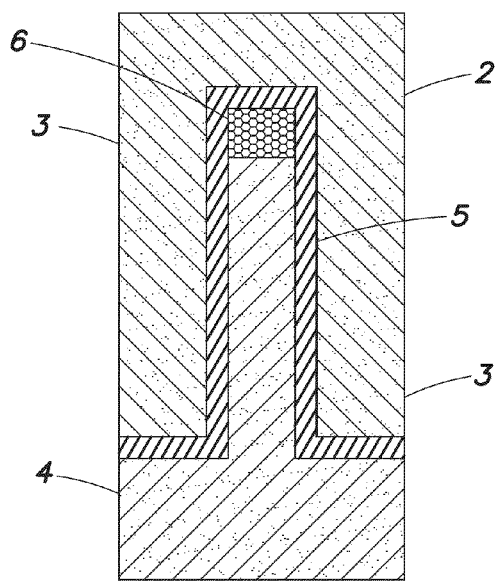
FIG. 2c shows a portion of FIG. 2b corresponding to a channel region in greater detail.

FIG. 2c shows a portion of FIG. 2b in greater detail, illustrating a region in which a channel is established between the first semiconductor region 4 and the second semiconductor region 6, such that current may flow between the source region 11 and the drain region 12. As shown in FIG. 2b, a plurality of such regions may be formed to establish a corresponding plurality of channels between the source and drain regions. In some embodiments, the trenches in the semiconductor region 4 may be patterned and formed parallel to one another. Between each of the trenches an upwardly-extending region of semiconductor region 4 exists in which a channel may be formed. Any suitable number of such channel regions may be formed.

In some embodiments, the first semiconductor region 4 and the second semiconductor region 6 may be formed of III-N semiconductor materials, as discussed above. For example, the first semiconductor region 4 may be formed of GaN (Gallium Nitride) and the second semiconductor region 6 may be formed of AlGaN (Aluminum Gallium Nitride). In some embodiments, the first semiconductor region 4 may include AlInGaN of a first composition ($Al_{x1}In_{y1}Ga_{z1}N$) and the second semiconductor region 6 may include AlInGaN of a second composition ($Al_{x2}In_{y2}Ga_{z2}N$). However, any suitable nitride or non-nitride semiconductor materials may be used. In some embodiments, semiconductor region 4 and/or 6 may include multiple layers of semiconductors. For example, in some embodiments the first semiconductor region 4 may include a GaN/InGaN/GaN structure and the second semiconductor region 6 may include an AlN/AlGaN structure.

Figure 2D:
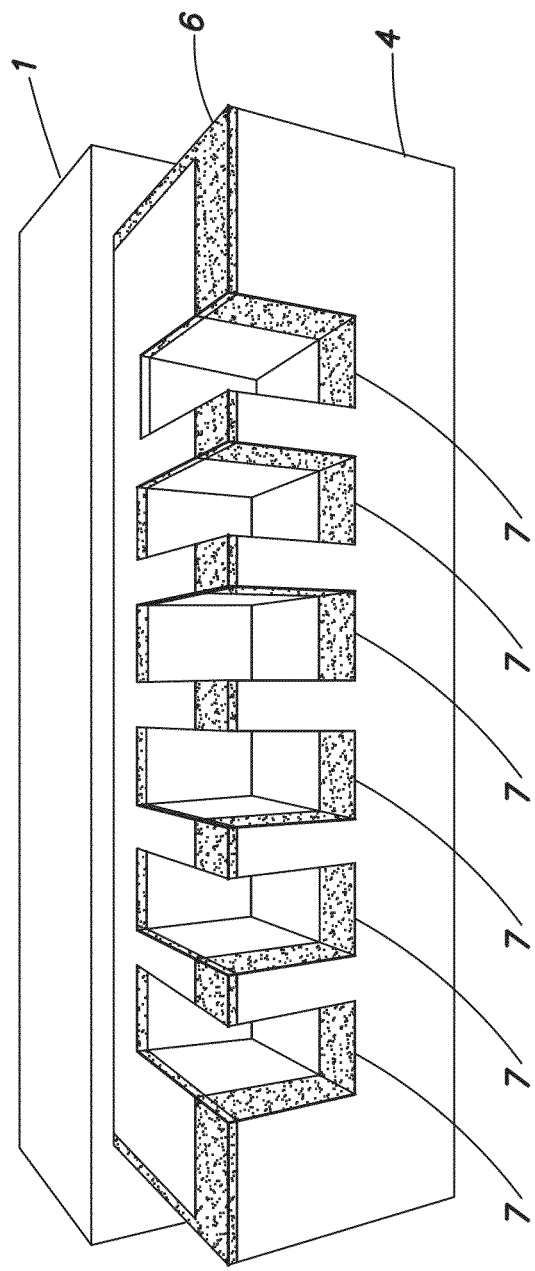
FIG. 2d illustrates a perspective view of the cross section shown in FIG. 2b.
Figure 2E:
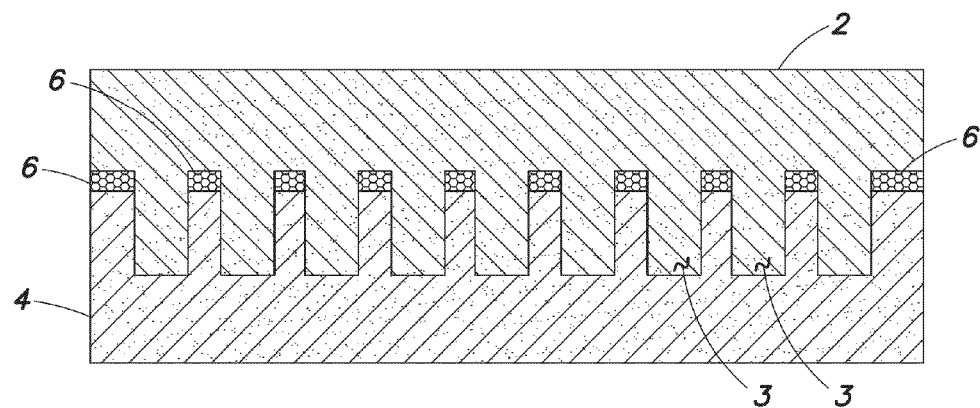
FIG. 2e shows a cross section of a field effect transistor without an insulating material between the semiconductor region and the electrode.
Figure 2F:
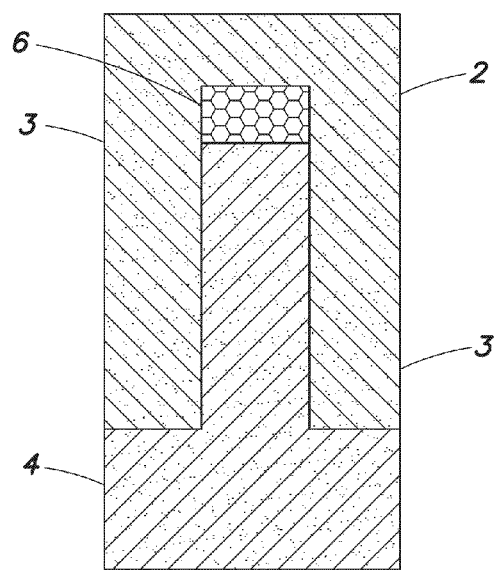
FIG. 2f shows a portion of FIG. 2e corresponding to a channel region in greater detail.

FIG. 2d illustrates a perspective view of the cross section shown in FIG. 2b. FIG. 2d illustrates that the lower regions 3 of electrode structure 1 are formed in trenches 7 in the semiconductor region 4. Though an insulating material 5 may be present between the electrode structure 1 and the semiconductor regions 4 and/or 6, insulating material 5 is not shown in FIG. 2d for clarity. Such an insulating material 5 may be desirable for reducing the gate leakage current. However, insulating material 5 is optional, as some embodiments do not include an insulating material 5 between the semiconductor region 4 and/or 6, and the electrode structure 1. FIG. 2e shows an embodiment in which insulating material 5 is not included. FIG. 2f shows a portion of FIG. 2e corresponding to a channel region in further detail. In some embodiments, an insulating material may be formed along only a portion of an interface between semiconductor regions 4 and/or 6 and electrode 1.

Figure 2G:
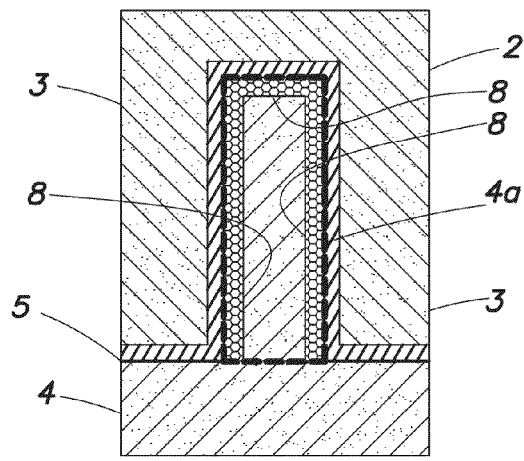
FIG. 2g shows a field effect transistor having channels on three sides of an upwardly-extending semiconductor region.

In some embodiments, a field effect transistor may be formed in which the cross section along the line B-B of FIG. 2a is as shown in FIG. 1b or 1c. That is, a field effect transistor may be formed without the second semiconductor region 6. Such a transistor may be a PMOS or NMOS transistor, for example, having source and drain regions of a first conductivity type (i.e., P-type or N-type) and an intermediate region of low or opposite conductivity type (i.e., N-type or P-type) in which a channel may be formed. Such a transistor can be controlled by changing the gate voltage to produce (or restrict) a channel region in which the conductivity of the intermediate region is inverted. When an electrode structure as illustrated in FIG. 1b or 1c is used, channel regions can be formed all along the interface between the electrode structure 1 and the semiconductor region 4. As shown in FIGS. 1b and 1c, upwardly-extending portions of the semiconductor region 4 extend toward the upper portion 2 of the electrode structure 1 between the lower regions 3 of the electrode structure 1. FIG. 2g illustrates that in each upwardly-extending region 4a of the semiconductor region 4, three channels 8 may be formed: a top channel and two channels extending along the sidewall of the upwardly-extending region 4a.

The field effect transistor 10 may be a normally-on (depletion mode) transistor or a normally-off (enhancement mode) transistor, for example. In a normally-off field effect transistor, a gate-source voltage of 0 V maintains the transistor in the off-state, and the transistor may sustain a blocking voltage across the source and drain terminals. To turn on the normally-off transistor, a positive gate-source voltage in excess of the threshold voltage of the transistor may be applied. In a normally-on field effect transistor, the transistor is on when a gate-source voltage of 0 V is present, allowing the transistor to conduct current through the channel region. To turn off the normally-on transistor, a negative gate-source voltage lower than the threshold voltage of the transistor may be applied.

Figure 2H:
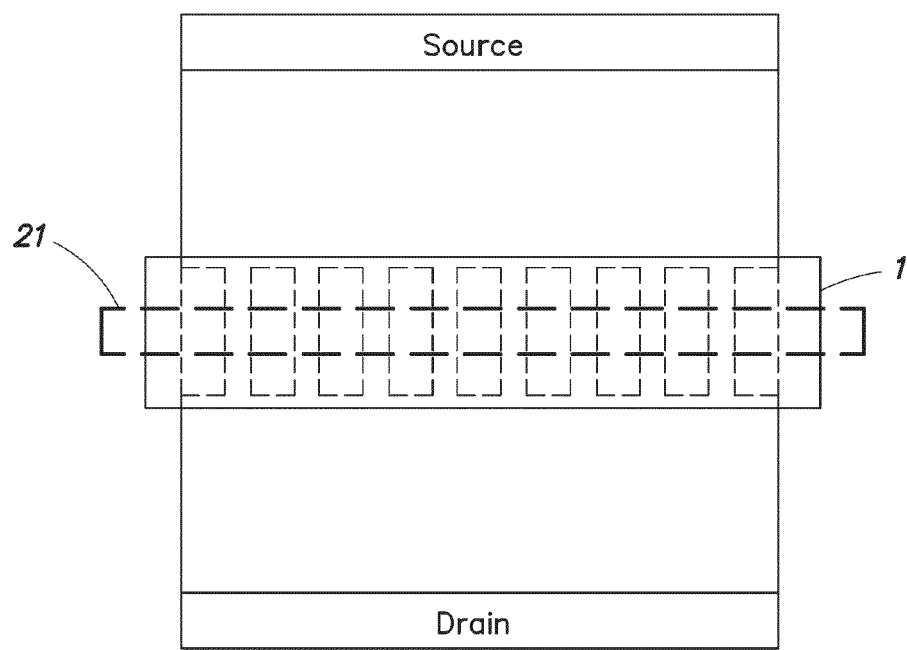
FIG. 2h shows a field effect transistor having a normally-off gate region, according to some embodiments.

In some embodiments, high performance normally-off nitride transistors can be fabricated that include an electrode structure as described herein and a normally-off gate region 21, as schematically illustrated in FIG. 2h. The normally-off gate region 21 may be formed across the trenches and semiconductor region 6. A conductive electrode structure 1 may be formed on the normally-off gate region 21. A normally-off gate region 21 can be formed by any suitable method, such as removing (e.g., recessing) a portion of semiconductor region 6 and/or by modifying the upper surface of semiconductor region 6. Suitable techniques for forming a normally-off gate region 21 include, by way of example, 1) a gate recess technique as described in W. B. Lanford, T. Tanaka, Y. Otoki, and I. Adesida, "Recessed-gate enhancement-mode GaN HEMT with high threshold voltage," *Electronics Letters*, vol. 41, p. 449, 2005 and W. Saito, Y. Takada, M. Kuraguchi, K. Tsuda, and I. Omura, "Recessed-gate structure approach toward normally off high-Voltage AlGaN/GaN HEMT for power electronics applications," *IEEE Transactions on Electron Devices*, vol. 53, pp. 356-362, February 2006, 2) plasma treatment as described in Bin Lu, O. I. Saadat, E. L. Piner, and T. Palacios, "Enhancement-mode AlGaN/GaN HEMTs with high linearity fabricated by hydrogen plasma treatment," in Device Research Conference, 2009. DRC 2009, 2009, pp. 59-60 and Yong Cai, Yugang Zhou, K. J. Chen, and K. M. Lau, "High-performance enhancement-mode AlGaN/GaN HEMTs using fluoride-based plasma treatment," IEEE Electron Device Letters, vol. 26, pp. 435-437, July 2005, 3) GaN MISFETs as described in W. Huang, T. Chow, Y. Niiyama, T. Nomura, and S. Yoshida, "730V, 34 mΩ-cm2 lateral epilayer RESURF GaN MOSFET," in Power Semiconductor Devices & IC's, 2009. ISPSD 2009. 21st International Symposium on, pp. 29-32 and Ki-Sik Im et al., "Normally Off GaN MOSFET Based on AlGaN/GaN Heterostructure With Extremely High 2DEG Density Grown on Silicon Substrate," IEEE Electron Device Letters, vol. 31, pp. 192-194, March 2010, 4) a gate-injection technique as described in Y. Uemoto et al., "Gate Injection Transistor (GIT)—A Normally-Off AlGaN/GaN Power Transistor Using Conductivity Modulation," *IEEE Transactions on Electron Devices*, vol. 54, pp. 3393-3399, 2007, 5) polarization engineering, by way of example, or any other suitable method. In some embodiments, the normally-off gate region may have a sub-micron gate length to reduce device on-resistance. The electrode structure 1 can reduce the buffer leakage and the short channel effect of the normally-off gate region 21. The gate electrode 1 may also increase the current density and reduce on-resistance by inducing sidewall channels and/or introducing mechanical deformation in semiconductor region 4 and 6 in a case where semiconductor regions 4 and 6 are formed of piezoelectric material.

In some embodiments, an electrode structure as described herein may be used as contacts for the source region of the transistor and/or the drain region of the transistor. For example, when an electrode structure as described herein is used as a contact (e.g., an ohmic contact) for the source region, the source region 11 illustrated in FIG. 2a may have trenches formed therein and an electrode structure as described herein may be used to make contact to the source region 11. When an electrode structure as described herein is used as a contact for the drain region of the transistor, drain region 12 may have trenches formed therein and an electrode structure as described herein may be used to make contact (e.g., an ohmic contact) to the drain region 12. Such electrodes may be used for both the source and the drain region, in some embodiments. Using such an electrode structure (e.g., a structure as discussed with respect to electrode structure 1) as a contact for the drain and/or source regions may allow reducing the on-resistance of the transistor by increasing the surface area of ohmic contacts at the source and/or drain regions. In piezoelectric semiconductors this arrangement may also introduce additional carriers in the contact region due to mechanical deformation of the semiconductor.

In some embodiments, an electrode structure 1 can be used as a field plate of a transistor. The field plate may have an electrode structure (e.g., such as described with respect to electrode structure 1) that is separate from the gate electrode. When such an electrode structure is used as a field plate it shapes the electric field distribution in the semiconductor region(s) of the transistor. A field plate may be maintained at a fixed voltage, set to a variable voltage, or allowed have a floating voltage. In some embodiments, an electrode structure 1 acting as a field plate can be electrically connected to the gate or the source such that the field plate is at the same voltage as the gate or source electrodes.

Figure 2I:
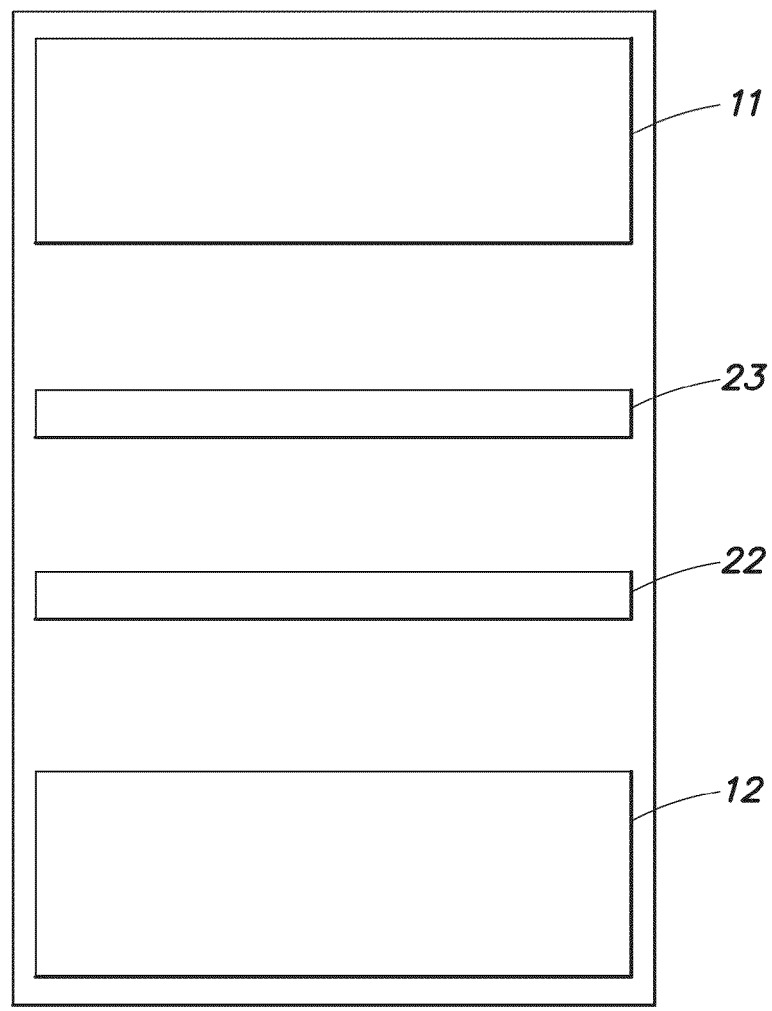
FIG. 2I shows a field effect transistor having a gate and a field plate, according to some embodiments.

FIG. 2I shows a field effect transistor having a source region 11, a drain region 12 and two electrode structures 22, 23. One or both of structures 22, 23 may have a structure as described above with respect to electrode structure 1. Electrode structure 22 may form the gate of the transistor and electrode structure 23 may form a field plate or the anode of a Schottky body diode for the transistor. Alternatively, in some embodiments electrode structure 22 may form a field plate or the anode of a Schottky body diode and electrode structure 23 may form the gate of the transistor. When the field effect transistor has a body diode, the anode of the body diode is positioned between the gate and the drain region and the anode is electrically connected to the source region. The anode of the Schottky body diode forms a Schottky contact with the underlying semiconductor material. If an insulating material 5 is present between the semiconductor and the electrode structure(s), an opening in the insulating material 5 can be formed to allow the Schottky contact between the anode electrode and the underlying semiconductor material to be formed.

Also, as discussed above, an electrode structure as described herein may be used as a contact for the source region of the transistor and/or the drain region of the transistor. Thus the transistor illustrated in FIG. 2I may have any number of electrode structures 1 between one and four (inclusive).

In some embodiments a larger number of electrode structures 1 may be used. For example, additional field plates and/or gates may be included having the structure of electrode structure 1. When more than one electrode structure 1 is used, each electrode may have the same structure or a different structure. For example, different electrodes may have the same structure (e.g., electrode structure 1a, 1d or 1e) or each may have a different structure selected from among electrode structure 1a, 1d and 1e. They may have the same cross section or a different cross section (e.g., as shown in FIGS. 1b and 1c).

In some embodiments, the field effect transistor 10 may be a power transistor that is configured to withstand high blocking voltages. For example, the field effect transistor 10 may be configured to block a voltage of from 0 V to a maximum blocking voltage. The maximum blocking voltage may be 100 V or greater, 500 V or greater, or 1000 V or greater. In some embodiments, the field effect transistor 10 may have a gate length of greater than or equal to 60 nm. When an electrode structure 1 is used as the gate electrode, the gate length can be considered to be the greater of lengths l2 and l3.

Figure 3A:
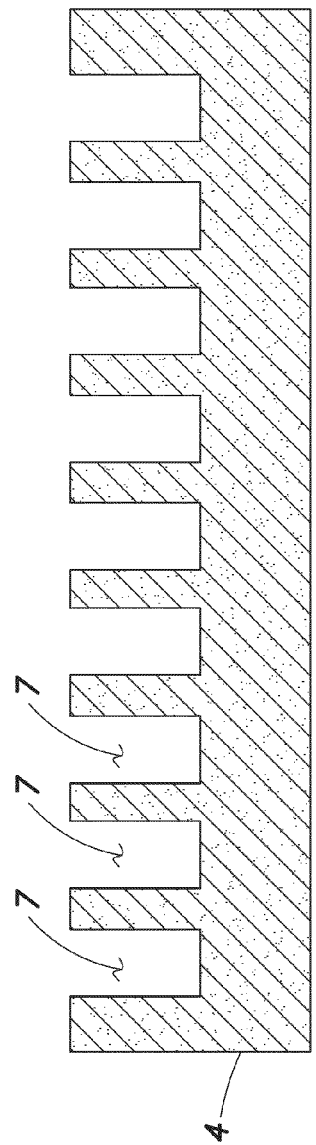
FIG. 3a shows the formation of trenches in a semiconductor region, according to some embodiments.
Figure 3B:
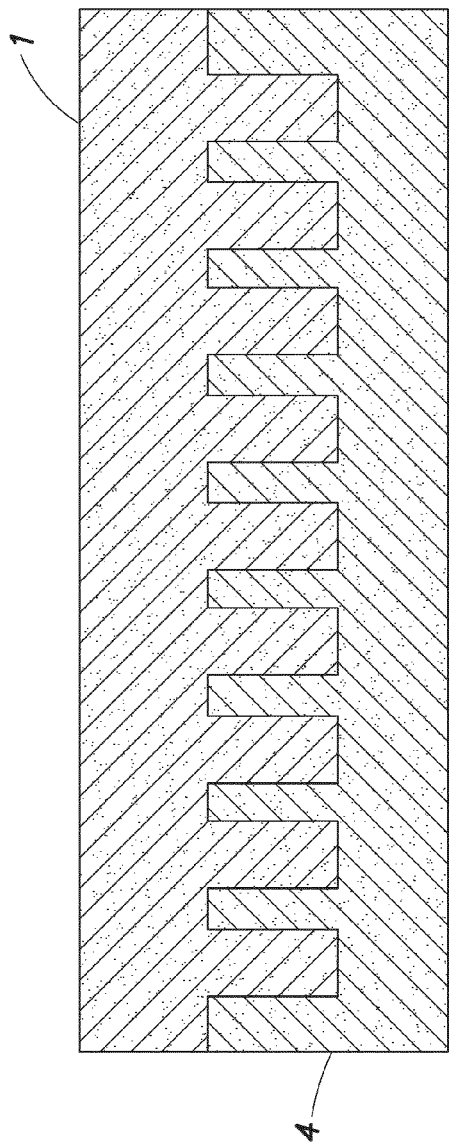
FIG. 3b shows the formation of an electrode structure at least partially within the trenches of the semiconductor region.

FIGS. 3a and 3b illustrate a method of forming an electrode structure 1, according to some embodiments. As shown in FIG. 3a, trenches 7 are formed in semiconductor region 4. The step of forming trenches 7 may include sub-steps of patterning and etching. The patterning sub-step may be performed using any suitable technique such as conventional lithography (e.g., using a stepper), interference lithography, electron beam lithography, or nano-imprint lithography, for example. However, any suitable patterning technique may be used. The etching sub-step may be performed using a mask such as a photoresist mask or a dielectric mask, for example. Etching may be performed in any suitable manner, such as using dry etching, e.g., reactive ion etching. However, any suitable etching technique may be used. In one exemplary implementation, patterning may be performed using interference lithography and etching may be performed using $Cl_2$-based dry etching, with the use of $SiO_2$ as an etching mask. After forming the trenches, an optional treatment may be performed to form a normally-off gate region, as discussed above. Optionally, an insulator material 5 (not shown) may be formed over the semiconductor region 4. The electrode structure 1 is then formed. As shown in FIG. 3a, the electrode structure 1 at least partially fills the trenches 7 of the semiconductor region 4 and an upper region of the electrode may be formed above the semiconductor region 4. Any suitable deposition technique may be used for forming the electrode structure 1.

Figure 4:
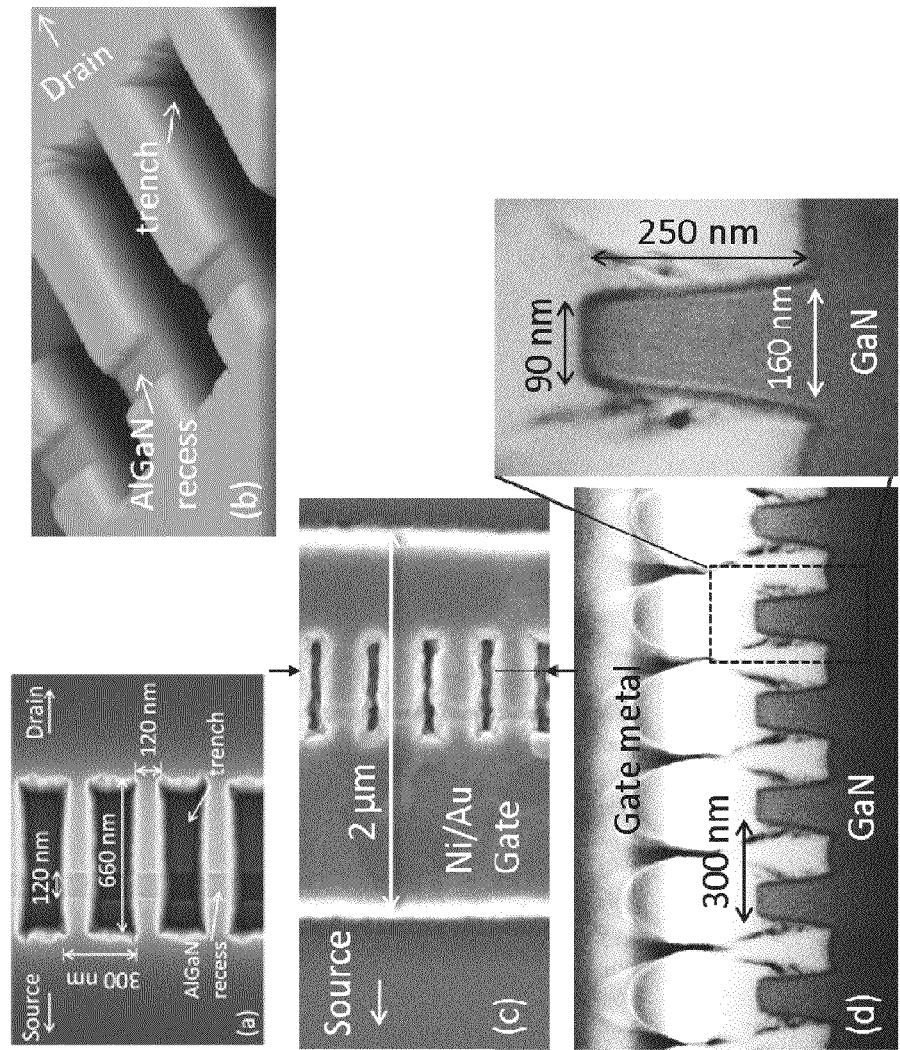
FIG. 4a-4d show scanning electron microscope and atomic force microscope images of an embodiment of a field effect transistor having an electrode structure as described herein.
Figure 5A:
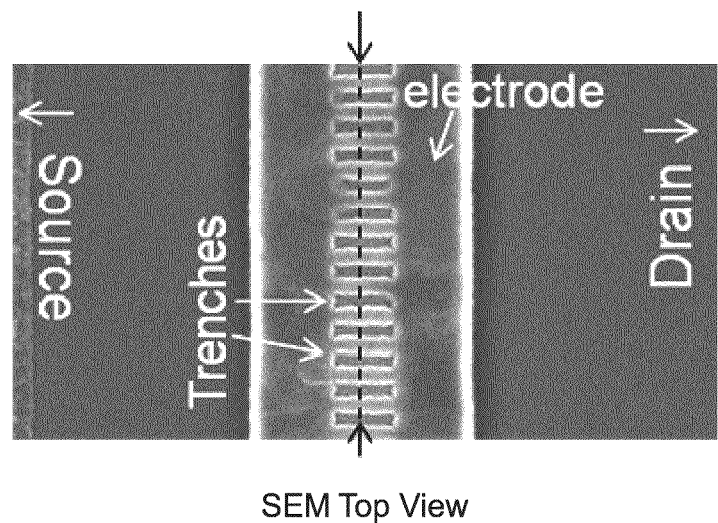
FIG. 5a-5b show additional scanning electron microscope images of an embodiment of a field effect transistor.
Figure 5B:
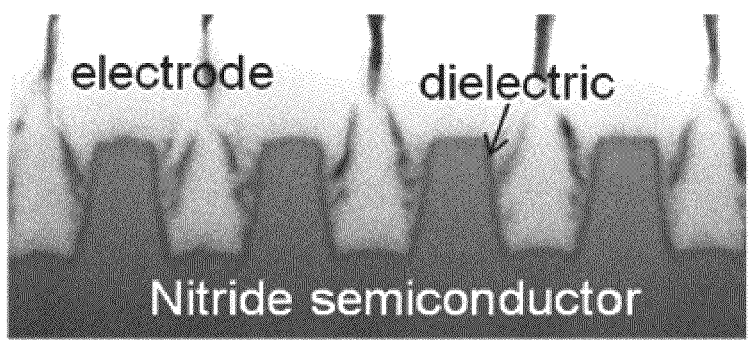

An example of a prototype device of a normally-off GaN transistor has been fabricated. The prototype device was fabricated on an $Al_{0.26}Ga_{0.74}N/GaN$ structure grown on a Si substrate using metal-organic chemical vapor deposition. The device fabrication included mesa-isolation, etching and Ti/Al/Ni/Au ohmic contact formation. The trench structure was formed into the AlGaN/GaN using interference lithography patterning and subsequently $Cl_2$-based reactive ion etching with $SiO_2$ as a dry etching mask. In this example, the trenches formed in the GaN have a periodic structure with a period p of 300 nm and having a trench height h of 250 nm, as shown in FIG. 4. A normally-off gate region was formed by recessing the AlGaN barrier across the trench structure with a gate length of 120 nm. A gate dielectric stack of 9 nm $SiO_2$/7 nm $Al_2O_3$ was deposited by atomic layer deposition (ALD) at 250° C. to form the insulating region 5. Finally, a Ni/Au gate electrode of $L_g=2$ μm was deposited covering the entire trench-structure and normally-off gate region as shown in FIG. 4. Additional SEM (Scanning Electron Microscope) images of the device are shown in FIGS. 5a and 5b.

As a reference, standard planar-MIS-gate AlGaN/GaN HEMTs were fabricated with the normally-off GaN transistor on the same sample. Both devices have the same dimensions of $L_{gs}=1.5$ μm, $L_g=2$ μm, $L_{gd}=10$ μm and W=100 μm. Therefore, the reference devices have the same gate dielectric stacks and were formed in the same process conditions.

Figure 6A:
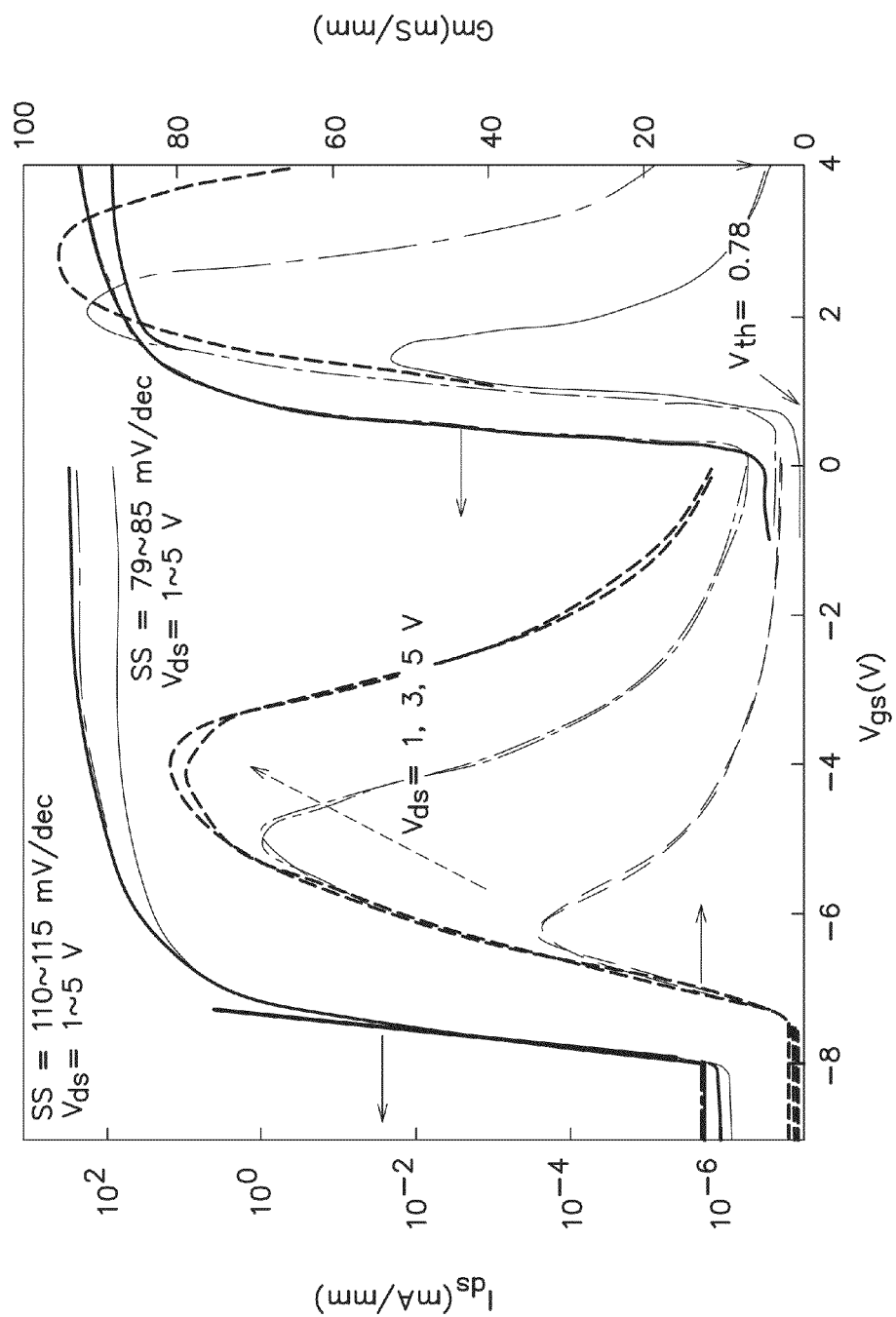
FIGS. 6a and 6b show the DC characteristics of a prototype normally-off GaN transistor.
Figure 6B:
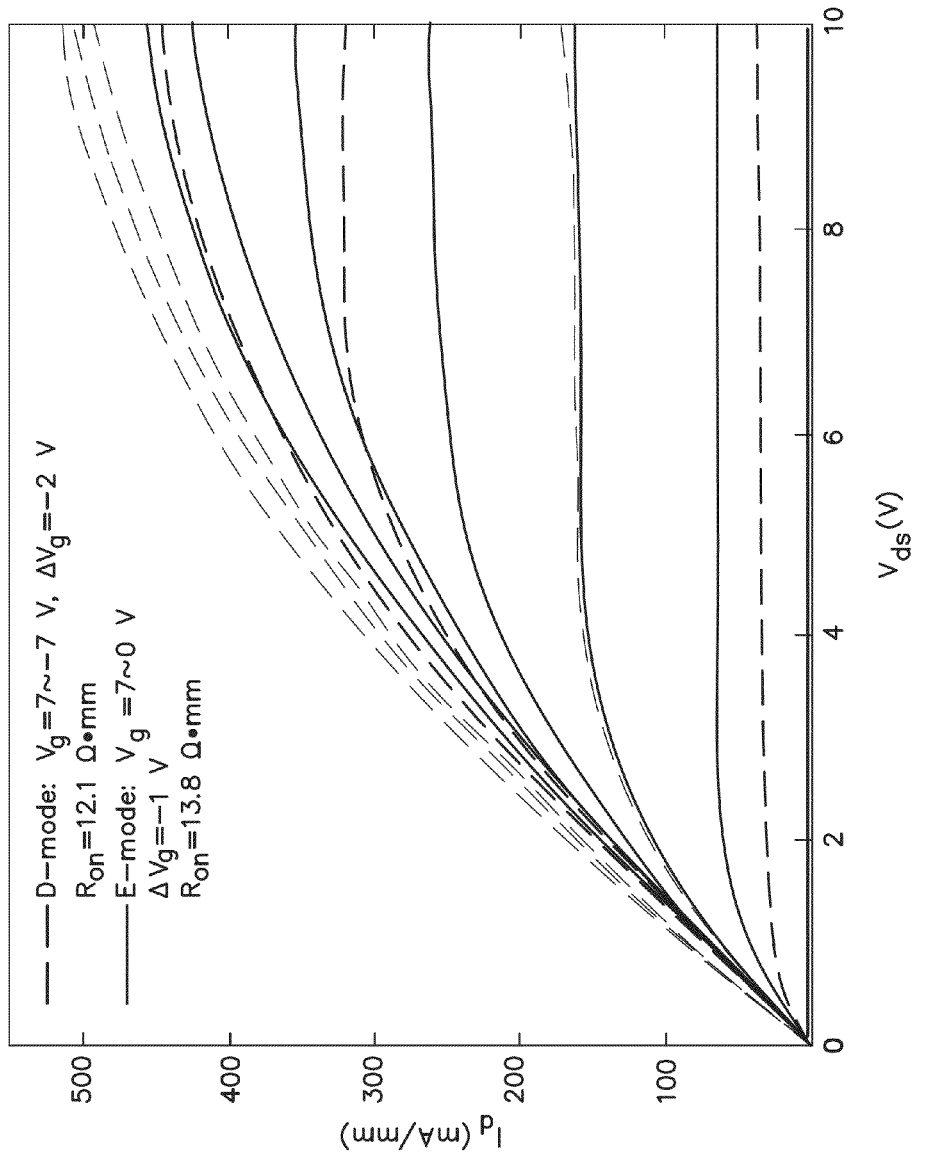

The DC characteristics of the prototype trench-structure normally-off GaN transistor are shown in FIGS. 6a and 6b, in which both devices are normalized by the same ohmic-contact width of 100 μm. FIG. 6a shows the transfer characteristics at $V_{ds}=1$, 3 and 5 V. FIG. 6b shows the $I_d$-$V_{ds}$ characteristics with max $V_{gs}=7$V. Compared with the conventional planar-gate GaN transistor, the prototype normally-off transistor has improved sub-threshold slope and lower off-state leakage current. The on-resistance of the trench-structure normally-off GaN transistors are 1.2-1.8 Ω·mm higher than the standard planar-gate transistors of the same dimensions.

Figure 7:
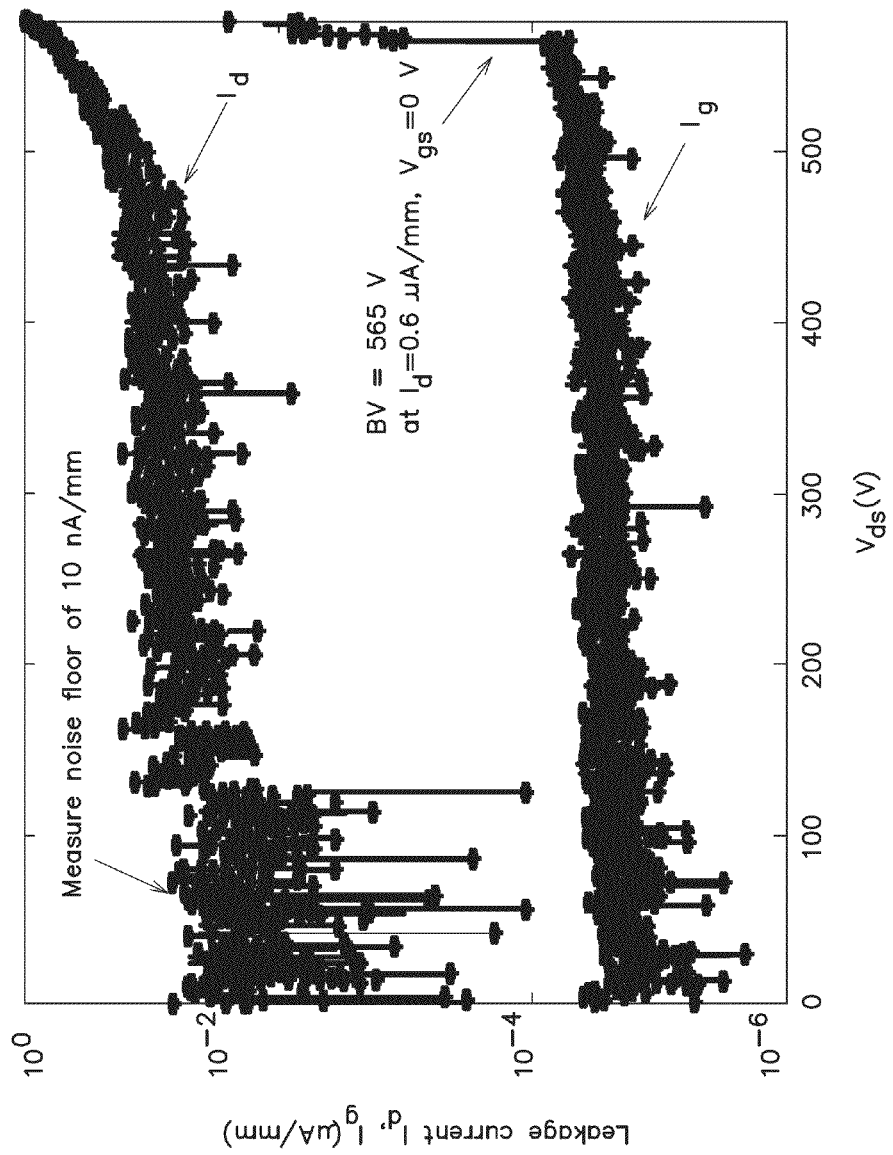
FIG. 7 shows a plot of leakage current as a function of $V_{DS}$.

The breakdown voltage of the prototype trench-structure normally-off GaN transistor is shown in FIG. 7. FIG. 7 shows a three-terminal breakdown voltage measurement of the transistors with $V_{gs}=0$V. The breakdown voltage is as high as 565 V at leakage current of 0.6 μA/mm and Vgs=0 V. The prototype device has a current on/off ratio of more than 8 orders of magnitude and a sub-threshold swing of 86±9 mV/decade. The threshold voltage is 0.8±0.06 V with a maximum drain current of 530 mA/mm.

Figure 8:
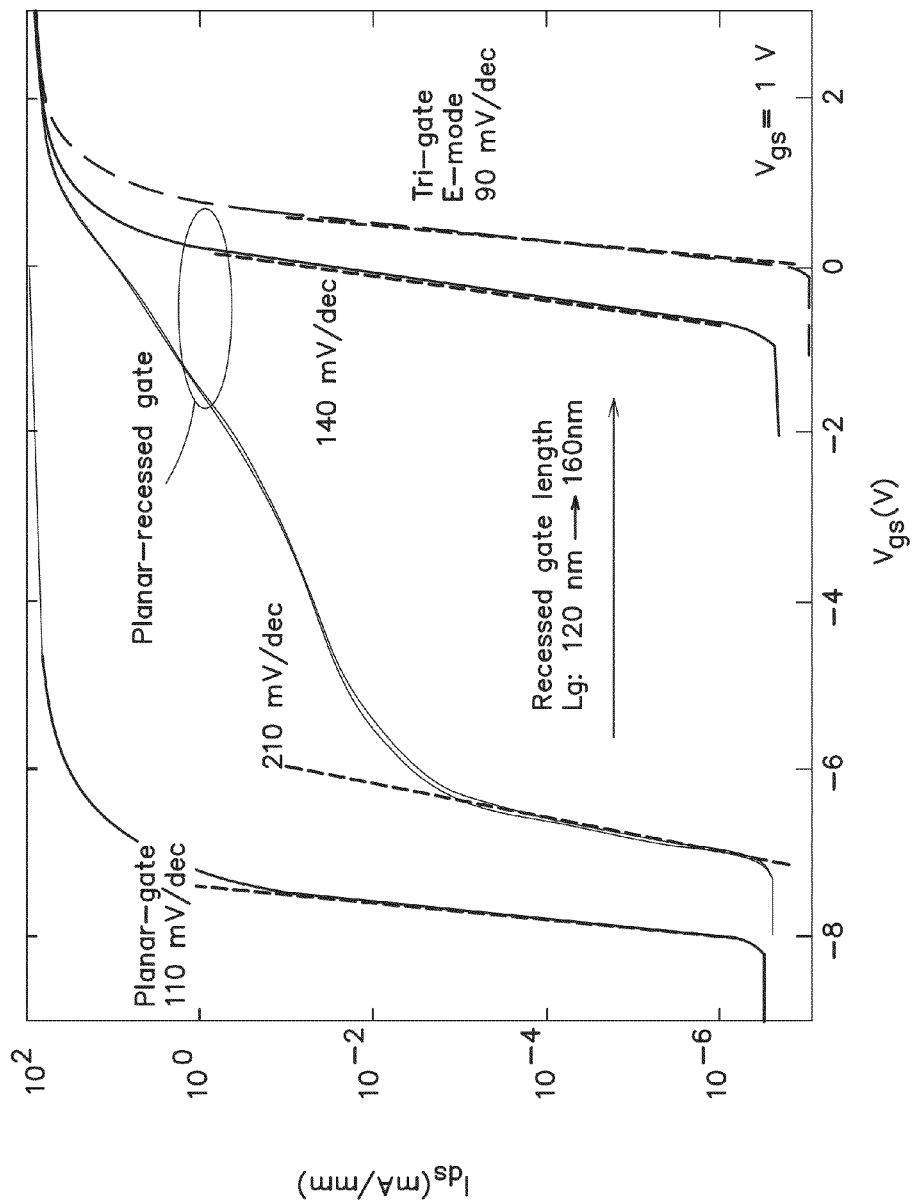
FIG. 8 shows a plot of current as a function of $V_{GS}$.
Figure 9:
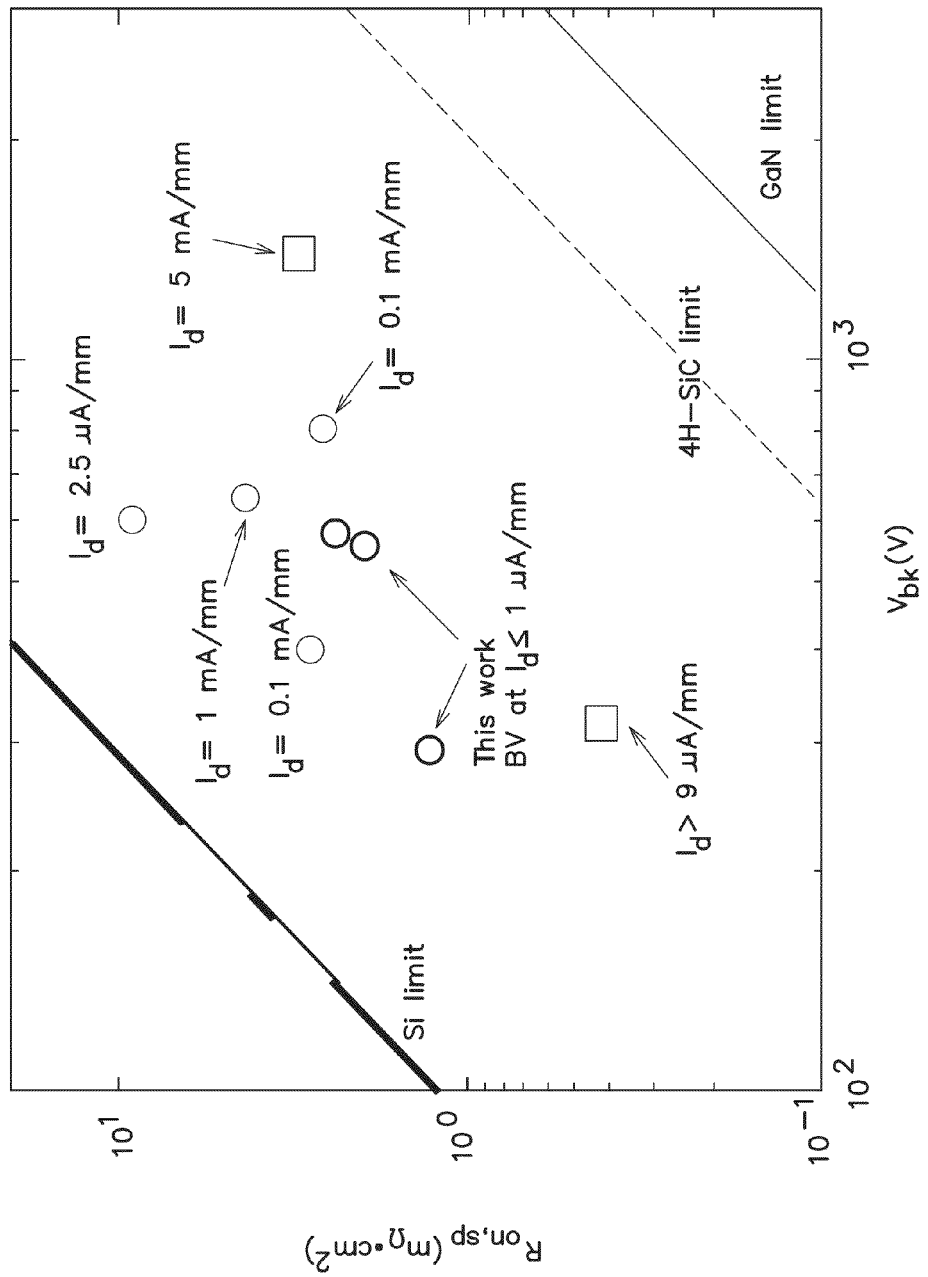
FIG. 9 shows a plot comparing various transistor technologies.

As shown in FIG. 8, a breakdown voltage as high as 565 V was measured at a drain leakage current of 0.6 μA/mm and Vgs=0 V. The specific on-resistance, calculated from the active areas between source and drain and 2 μm transfer length from each contact, of several tri-gate normally-off GaN MISFETs is plotted in FIG. 9. Compared to the previous results, the new device demonstrates a new milestone for the low-leakage normally-off GaN transistors.

Figure 10B:
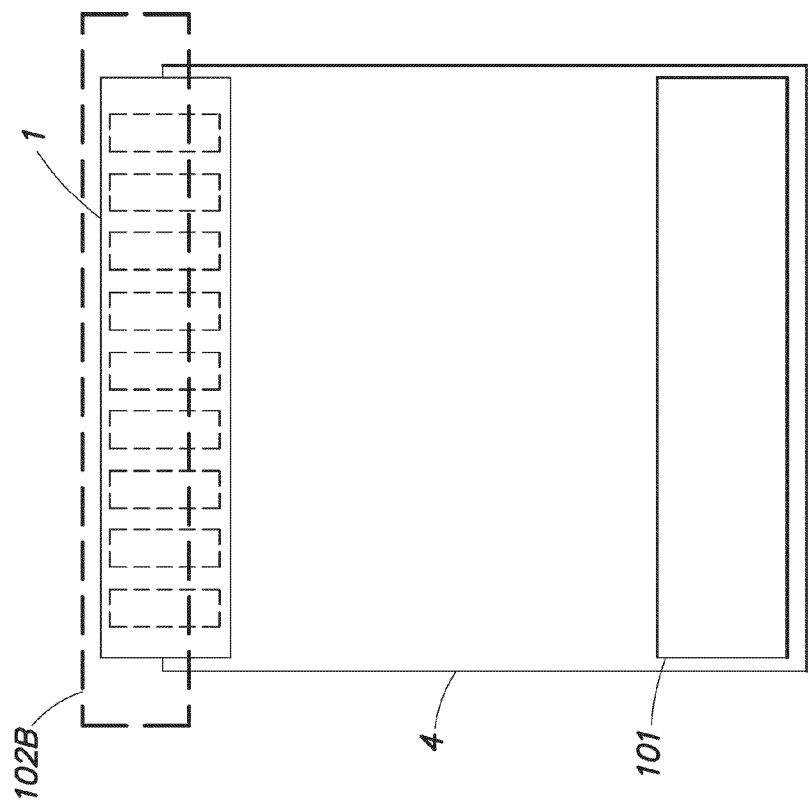
FIGS. 10a and 10b show top views of diode structures, according to some embodiments.
Figure 10A:
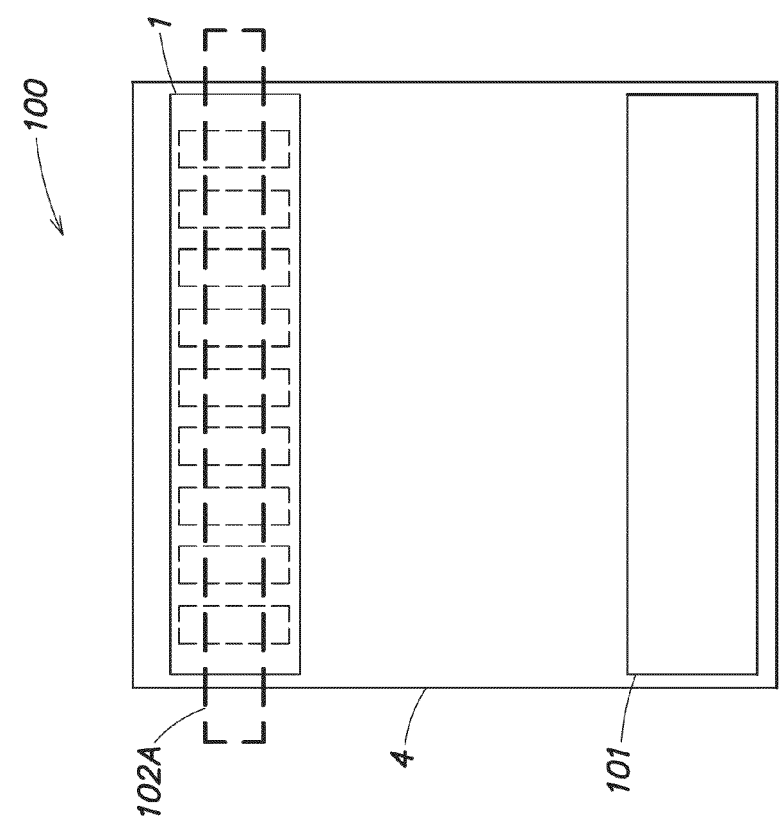

FIG. 10a shows an example of a diode 100 that includes at least one electrode structure as described herein. As shown in FIG. 10a, the diode includes an electrode structure 1 forming an anode of the diode. The anode of the diode may have a cross-section as illustrated in in FIGS. 2b-2f, and may or may not include an insulating material 5. The insulating material may be partially opened so that a portion of the semiconductor region makes Schottky contact with the electrode structure 1 and another portion of the semiconductor region is separated from the electrode structure 1 by an insulating material. As shown in FIG. 10a, the insulating material may be removed or otherwise not present within region 102a, such that electrode structure 1 may contact the underlying semiconductor material within region 102a. An insulating material may be present between the electrode structure 1 and the underlying semiconductor material in the region of electrode structure 1 outside of region 102a. FIG. 10b shows another embodiment showing another example of a region 102b in which the insulating material may be removed or otherwise not present, such that electrode structure 1 may contact the underlying semiconductor material within region 102b. An insulating material may be present between the electrode structure 1 and the underlying semiconductor material in the region of electrode structure 1 outside of region 102b. As discussed above, the electrode structure 1 may have lower portions that extend into the semiconductor region 4, e.g., within trenches in the semiconductor region 4. Any suitable electrode structure 1 may be used, such as the electrode structures illustrated in FIG. 1a, FIG. 1b and FIG. 1c. In this example, diode 100 is a Schottky diode in which electrode structure 1 forms a Schottky contact with the semiconductor region 4. Diode 100 also includes an electrode 101 making contact (e.g., an ohmic contact) with the cathode of the diode 101. Electrode 101 may be formed as a conventional electrode or as an electrode structure 1 as described herein.

The use of an electrode structure 1 as the anode can reduce the reverse-biased leakage current through lateral depletion of the 2D electron plasma or at the sidewalls of the upwardly-extending portions of semiconductor region 4 due to the lower regions 3 of the electrode structure 1. The turn-on resistance and turn-on voltage of the diode can be reduced by contacting the 2D electron plasma to the electrode structure 1 at the lower regions 3 of the electrode structure 1 extending down on the sidewalls of the semiconductor regions 4 and 6. However, the techniques herein are not limited to diodes having a 2D electron gas or to Schottky diodes, as other types of diodes may be used.

Figure 11:
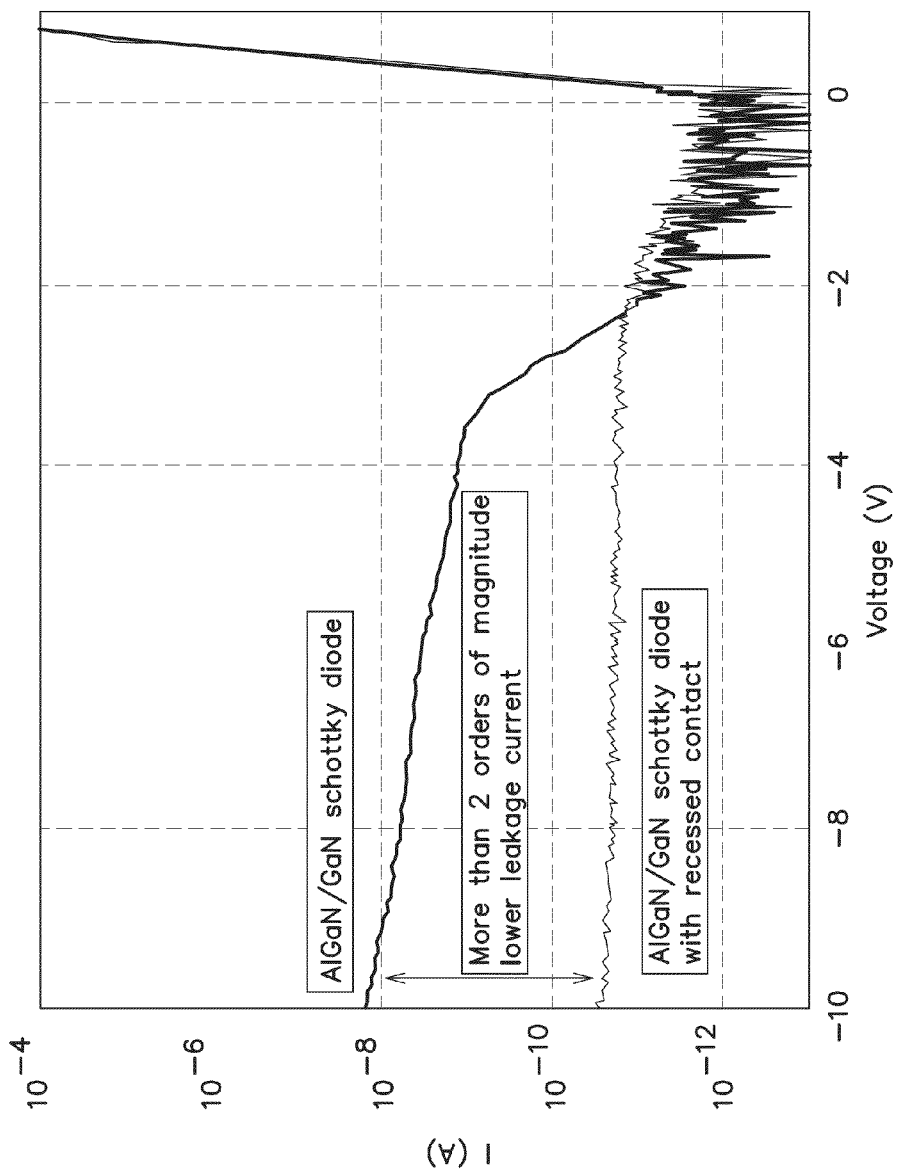
FIG. 11 shows the current vs. voltage characteristics of a prototype AlGaN/GaN Schottky diode with recessed anode according to some embodiments.

A prototype of an AlGaN/GaN Schottky diode was fabricated with recessed anode according to some of the embodiments described above. The current-voltage characteristics of the AlGaN/GaN Schottky diode with recessed anode and of a regular AlGaN/GaN Schottky diode are shown in FIG. 11. The Schottky diode with recessed anode shows a reduction of more than two orders of magnitude in reverse leakage current.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A diode, comprising:
   a semiconductor region having trenches formed therein;
   a conductive electrode forming an anode of the diode, the conductive electrode including conductive regions formed in the trenches of the semiconductor region; and
   a cathode,
   wherein the conductive electrode contacts the semiconductor region inside the trenches, outside the trenches, or both,
   wherein the semiconductor region includes a III-N semiconductor material, and
   wherein the semiconductor region is a first semiconductor region, the III-N semiconductor material is a first III-N semiconductor material, and the diode further comprises a second semiconductor region including a second III-N semiconductor material different from the first semiconductor material, wherein the first semiconductor region is between the second semiconductor region and the conductive electrode.

2. The diode of claim 1, wherein the second III-N semiconductor material includes a GaN semiconductor material.

3. The diode of claim 1, wherein the first semiconductor region and/or the second semiconductor region comprises a plurality of semiconductor layers.

4. The diode of claim 1, wherein the conductive electrode includes a metal or a metal alloy.

5. The diode of claim 1, wherein the diode further comprises an insulating region between the first semiconductor region and the conductive electrode, the insulating region extending at least partially across an interface between the first semiconductor region and the conductive electrode.

6. The diode of claim 1, wherein the diode is a Schottky diode.

7. The diode of claim 6, wherein a first portion of the first semiconductor region makes Schottky contact with the conductive electrode.

8. The diode of claim 7, wherein a second portion of the first semiconductor region is separated from the conductive electrode by an insulating region.

9. The diode of claim 1, wherein the trenches are spaced apart at periodic intervals.

10. The diode of claim 1, wherein the conductive electrode contacts the first semiconductor region in the trenches.

11. The diode of claim 1, wherein the conductive electrode contacts the first semiconductor region outside the trenches.

12. The diode of claim 1, wherein the conductive electrode contacts the first semiconductor region both inside the trenches and outside the trenches.

13. The diode of claim 1, wherein an electrode of the cathode forms an ohmic contact.

14. The diode of claim 1, wherein the trenches extend into the second semiconductor region.

15. The diode of claim 1, wherein the first III-N semiconductor material has a bandgap higher than that of the second III-N semiconductor material.

* * * * *